United States Patent
Timmering et al.

(10) Patent No.: US 10,090,437 B2
(45) Date of Patent: Oct. 2, 2018

(54) LED HAVING ETCHED LIGHT EMITTING SURFACE FOR INCREASED LIGHT EXTRACTION

(71) Applicant: KONINKLIJKE PHILIPS N.V., Eindhoven (NL)

(72) Inventors: Cornelis Eustatius Timmering, Eindhoven (NL); Marcus Antonius Verschuuren, Eindhoven (NL); Toni Lopez, Eindhoven (NL); Abraham Rudolf Balkenende, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 14/762,568

(22) PCT Filed: Jan. 31, 2014

(86) PCT No.: PCT/IB2014/058704
§ 371 (c)(1),
(2) Date: Jul. 22, 2015

(87) PCT Pub. No.: WO2014/122565
PCT Pub. Date: Aug. 14, 2014

(65) Prior Publication Data
US 2015/0364647 A1    Dec. 17, 2015

Related U.S. Application Data

(60) Provisional application No. 61/763,015, filed on Feb. 11, 2013.

(51) Int. Cl.
*H01L 33/00* (2010.01)
*H01L 33/22* (2010.01)

(52) U.S. Cl.
CPC .......... *H01L 33/22* (2013.01); *H01L 33/0075* (2013.01)

(58) Field of Classification Search
CPC .............................. H01L 33/22; H01L 33/025
(Continued)

(56) References Cited

U.S. PATENT DOCUMENTS 8,859,308 B2 * 10/2014 Zhu .................. H01L 33/04
362/308
2004/0113167 A1 * 6/2004 Bader .................. H01L 33/20
257/98

(Continued)

FOREIGN PATENT DOCUMENTS

EP         1536487 A1    6/2005
TW      200906438 A    6/2009
(Continued)

OTHER PUBLICATIONS

Bao et al, "Improvement of Light-Extraction from Micro-Pattern Encapsulated..." Light Emitting Diodes: Research, Manufacturing and Applications XII, Proc. of SPIE, vol. 6910 (2008).

(Continued)

*Primary Examiner* — Joseph C Nicely
*Assistant Examiner* — Wilner Jean Baptiste (57) ABSTRACT

The present invention relates to a light emitting device (100) comprising: a substrate (102); a light emitting diode structure (106) arranged on the substrate (102), the diode structure (106) comprising a first semiconducting layer (108), an active region (110) and a second semiconducting layer (112), wherein a light output surface of the diode structure comprises a plurality of protruding surface structures (104) each having a peak height, a sidewall slope (122) and orientation in relation to the substrate, the plurality of protruding structures (104) comprising a first set and a second set of protruding surface structures, the first set and second set of protruding surface structures differing by at least one of the peak height, sidewall slope and orientation in relation to the substrate. The invention also relates to a (Continued)

method for manufacturing a light emitting device where the protruding surface structures are formed by imprint lithography to form a three-dimensional pattern and subsequent etching.

11 Claims, 5 Drawing Sheets

(58) Field of Classification Search
USPC .................................................. 257/76, 103
See application file for complete search history.

(56) References Cited

U.S. PATENT DOCUMENTS

| | | |
|---|---|---|
| 2006/0175625 A1 | 8/2006 | Yokotani et al. |
| 2006/0258027 A1* | 11/2006 | Ohmae .............. H01L 33/007 438/22 |
| 2008/0067916 A1* | 3/2008 | Hsu .................. H01L 33/007 313/498 |
| 2009/0159907 A1* | 6/2009 | Wang ................ H01L 33/24 257/94 |
| 2010/0096652 A1* | 4/2010 | Choi ................. H01L 33/08 257/98 |
| 2011/0101404 A1* | 5/2011 | Fu .................... H01L 33/38 257/98 |
| 2011/0263128 A1 | 10/2011 | Duncan et al. |
| 2012/0032306 A1 | 2/2012 | Baur |
| 2012/0126241 A1 | 5/2012 | Okuno et al. |
| 2012/0193664 A1* | 8/2012 | Lin ................... H01L 33/20 257/98 |
| 2012/0208307 A1 | 8/2012 | Lee et al. |
| 2012/0286286 A1 | 11/2012 | Jung |
| 2013/0285109 A1* | 10/2013 | Narita ............... H01L 21/0242 257/103 |
| 2013/0313596 A1* | 11/2013 | Fu .................... H01L 33/22 257/98 |
| 2013/0328083 A1* | 12/2013 | Zhu .................. H01L 33/58 257/98 |

FOREIGN PATENT DOCUMENTS

| | | |
|---|---|---|
| TW | 201232820 A | 8/2012 |
| TW | 201248725 A | 12/2012 |
| TW | 201342661 A | 10/2013 |

OTHER PUBLICATIONS

Taiwan Office Action dated Aug. 21, 2017, TW Patent Application No. 103104308, 10 pages.
Taiwan Office Action dated Mar. 20, 2017, TW Patent Application No. 103104308, 12 pages.
First Office Action dated May 4, 2017, China Patent Application No. 201480008311.0, 18 pages.
EPO as ISA, PCT/IB2014/058704 filed Jan. 31, 2014, "International Search Report and Written Opinion", dated Jun. 3, 2014, 10 pages.
Second Office Action dated Jan. 4, 2018, China Patent Application No. 201480008311.0, 12 pages.

* cited by examiner

LED HAVING ETCHED LIGHT EMITTING SURFACE FOR INCREASED LIGHT EXTRACTION

CROSS-REFERENCE TO PRIOR APPLICATIONS

This application is the U.S. National Phase application under 35 U.S.C. § 371 of International Application No. PCT/IB2014/058704, filed on Jan. 31, 2014, which claims the benefit of U.S. Patent Application No. 61/763,015, filed on Feb. 11, 2013. These applications are hereby incorporated by reference herein.

FIELD OF THE INVENTION

The present invention relates to a light emitting device. In particular, the present invention relates to a light emitting diode, and to a method for manufacturing such a light emitting diode.

BACKGROUND OF THE INVENTION

Solid state light emitting devices such as light emitting diodes (LEDs) and solid state lasers are used in a wide range of applications from conventional lighting systems to optical communication systems. LED-based lighting systems are increasingly popular due to the low energy consumption and long life length of LEDs in comparison to incandescent light sources.

Even though LEDs already are more energy efficient than conventional light bulbs, it is desirable to further improve the energy efficiency of the LED. However, extraction of light generated in an LED is limited by trapping of light within the device due to total internal reflection of light reaching the interface between the LED and a surrounding material at angles exceeding the Brewster angle. In particular, extraction efficiency is limited by the difference in refractive index between the LED and the surrounding material. As an example, in a GaN-based LED terminated in a flat GaN surface, only about 4% of the generated light is actually emitted.

There have been different attempts aimed at improving the extraction efficiency, such as for example forming a GaN LED on a textured sapphire substrate in order to form an interface where the amount of total internal reflection is reduced. The extraction efficiency may also be improved by roughening the light extraction surface using various surface treatment methods. However, surface roughening suffers from a low degree of control over the resulting surface properties and chip-scale LED processing is complicated.

US2011/0263128 suggests using selective wet etching to form a pattern comprising protrusions or indentations in a GaN layer of a light emitting diode in order to influence the extraction efficiency and/or collimation of light emitted by the LED. US2011/0263128 also discloses patterning the surface of a sapphire substrate through selective wet etching.

Even though the extraction efficiency may be improved through the aforementioned approach, it is still desirable to further improve the extraction efficiency in a light emitting diode.

SUMMARY OF THE INVENTION

It is an object of the present invention to provide a light emitting device offering improved light extraction properties, and to provide a method for manufacturing such a light emitting device.

According to a first aspect of the invention, this and other objects are achieved by a light emitting device comprising a substrate, a light emitting diode (LED) structure arranged on the substrate, the diode structure comprising a first semiconducting layer, a second semiconducting layer, and an active region sandwiched between the first and second semiconducting layer, at least one of the first and second semiconducting layer having a light output surface facing away from the active region wherein the light output surface comprises a plurality of protruding surface structures each having a peak height, a sidewall slope and an orientation in relation to the substrate, the plurality of protruding surface structures comprising a first set and a second set of protruding surface structures, the first set and second set of protruding surface structures differing by at least one of peak height, sidewall slope and orientation in relation to the substrate.

A substrate should in the present context be understood as a structure which is planar on a macroscopic scale, serving as a base for a light emitting device, where the respective layers of the light emitting diode are deposited consecutively on the substrate. The peak height and sidewall slope are defined in relation to a reference plane parallel with the substrate and the orientation of the surface structure should be understood as the relative alignment of the structure in the reference plane.

The present invention is based on the realization that the extraction efficiency of light from a light emitting diode can be improved by controlling the geometry of a light output surface such that the surface comprises structures of different shapes, heights or orientation. Thereby, the difference between structures can be selected so that extracted light is prevented from re-entering into the light emitting diode. In particular the orientation in relation to an adjacent structure or the sidewall slope of such structures can be tailored to minimize re-entering of light. For example, this may mean that structures are arranged so that similarly configured sidewalls are not facing each other. Furthermore, total internal reflection within the light emitting diode can be reduced as the steepness of the slope of the structure defining the interface can be selected, thereby further improving the extraction efficiency.

A surface comprising a pattern of three-dimensional surface structures differing by at least one of peak height, sidewall slope and orientation in relation to the substrate can be achieved through imprint lithography and subsequent etching. Using imprint lithography, a three-dimensional pattern comprising a large variety of shapes of the protruding surface structures can be provided which advantageously is used to increase the extraction efficiency. The method for manufacturing a light emitting device using imprint lithography will be discussed in further detail below in relation to another aspect of the invention.

According to one embodiment of the invention, the light emitting device may comprise a first set of protruding surface structures exhibiting a peak height and a sidewall slope different from the second set of protruding surface structures. Surface structures may be formed which differ both in height, sidewall slope, orientation and geometry, depending on the material properties of the LED and the desired resulting light extracting properties. The plurality of surface structures may for example comprise a first set of structure arranged in a first predetermined pattern and a second set of surface structures arranged in a second predetermined pattern, different form said first predetermined pattern.

In one embodiment of the invention, at least one protruding surface structure may have a sidewall slope having an angle larger than 50° in relation to said substrate. It may be desirable to provide a structure having steep sidewalls as extraction efficiency can be improved through reduction of total internal reflection. For example, a pyramid structure with sidewalls steeper than 50° in relation to the plane of the substrate may be used. The slope angle is defined as the inner sidewall angle as seen in a triangle shape. In particular, it may be desirable to provide structures having a sidewall angle larger than what is achievable through anisotropic wet etching of a particular semiconductor material.

In one embodiment of the invention, the plurality of protruding surface structures may for example be arranged in a pseudo-random pattern. A pseudo-random arrangement of surface structures may be advantageous as a homogeneous light output distribution from the surface of the LED can be provided. Thus, various diffraction phenomena can be avoided.

In one embodiment of the invention, at least one sidewall slope angle of a protruding surface structure may be different from that of an adjacent protruding surface structure. The possibility of forming neighboring surface structures having different properties allows for selecting a sidewall slope of a neighboring structure so that extracted light is prevented from re-entering into the light emitting diode.

According to one embodiment of the invention, one of said first and second semiconductor layer may be a p-type doped layer and the other is an n-type doped layer. In particular, one of the first and second semiconductor layers may be a p-type GaN layer and the other may be an n-type GaN layer.

In one embodiment of the invention, one of the first and second semiconductor layers may comprise a non-doped or n-doped buffer region forming the light output surface. The surface structures may equally well be formed in a non-doped or lightly n-doped buffer layer arranged adjacent to either of the first and second semiconductor layers, on the side facing away from the active region.

Furthermore, the substrate may advantageously be selected from a group comprising sapphire, Si and SiC. GaN-based LEDs on sapphire substrates are advantageously used as the material combination is well known and as established processing methods are readily available. However, the general concept of the present invention may equally well be applied to a light emitting device of any material combination where it is desirable to improve extraction efficiency. As an example, non-crystalline substrates such as quartz-like glass substrates may be used as a base for forming surface structures.

Moreover, the active region of the light emitting diode structure may advantageously be a multiple quantum-well structure.

According to a second aspect of the invention, there is provided a method for manufacturing a light emitting device comprising the steps of: providing a substrate; depositing a mask layer on the substrate; forming a three-dimensional pattern in the mask layer using imprint lithography; etching the mask layer and the substrate such that a three-dimensional pattern, corresponding to the three dimensional pattern of the mask layer, is formed in the substrate; and on the substrate, depositing a light emitting diode structure comprising a first semiconductor layer; an active region and a second semiconductor layer.

The etched three dimensional pattern formed in the substrate must not be an exact replica of the mask pattern, there may be differences for example in the slope of the structures. Truncation of the resulting etched surface structures in the substrate may also be possible if etching is stopped before all of the resist is etched away. Furthermore, the pattern of the mask and the resulting etched pattern in the substrate may also differ if etching is continued after the mask layer is removed. Accordingly, as the light emitting diode structure is formed on the patterned substrate, the interface between the substrate and the first semiconductor layer is defined by the three dimensional pattern. Moreover, the first semiconductor layer may be sufficiently thick so that the surface on which the active region is formed is substantially planar.

According to a third aspect of the invention, there is provided a method for manufacturing a light emitting device comprising the steps of: providing a first substrate; on the first substrate, depositing a light emitting diode structure comprising a first semiconductor layer, an active region and a second semiconductor layer; depositing a mask layer on the light emitting diode structure; forming a three-dimensional pattern in the mask layer using imprint lithography; and etching the mask layer and the light emitting diode structure such that a three-dimensional pattern, corresponding to the three-dimensional pattern of the mask layer, is formed in the light emitting diode structure.

The second and third aspects of the invention are largely similar where imprint lithography is used to form a three-dimensional pattern in a mask layer, which is transferred to an underlying layer through etching. The difference between the two aspects is that that in the second aspect, imprint lithography is used to form a three-dimensional pattern in the substrate of the light emitting device which serves as a base for the subsequent deposition of a light emitting diode structure, while in the third aspect, imprint lithography is used to form a three-dimensional pattern directly in the light emitting diode structure.

In imprint lithography, the desired pattern is first defined onto an imprinting master by conventional lithographical methods or by gray-scale e-beam lithography. The master is subsequently etched to obtain a master having a predetermined three-dimensional pattern. Sizes and shapes of features in the pattern are determined by the pattern layout together with the etching parameters used when forming the imprinting master. Following that, a flexible silicone stamp is molded from the master. The stamp can then be used to pattern a soft layer such as a suitable etch resist. The use of a flexible stamp is advantageous as large areas may be homogeneously contacted without the use of high pressures which may deform the pattern. As is readily realized by the person skilled in the art, many different methods are available for forming an imprinting master and a subsequent stamp.

An advantage of using a three-dimensional etch mask formed by imprint lithography, and transferring the pattern of the mask to either the substrate or to a semiconductor layer by suitable etching methods, is that the shape and sidewall slope of the resulting structures are not limited by the crystallographic properties of the etched material.

According to one embodiment of the second or third aspect of the invention, the following steps may be performed between the steps of depositing a light emitting diode structure and depositing a mask layer: bonding a carrier substrate to the light emitting diode structure and removing the first substrate. By bonding a carrier substrate to the second semiconductor layer of the light emitting diode structure and the subsequently removing the original substrate, a so called flip-chip process, it is possible to form a three dimensional pattern in the first semiconductor layer which was formed on the original substrate. Bonding should not be narrowly construed, as bonding here refers to the mounting of the light emitting diode structure to a second carrier substrate, the specific method of mounting may be different for different applications and/or material combinations.

In one embodiment of the invention, the step of etching may advantageously be performed by dry etching. By using dry etching, the pattern of the mask layer can be transferred into the layer underneath as the mask is gradually etched away. The ratio of etch rate between the mask and the underlying material will determine the slope of the resulting structures. Specific etch parameters may have to be developed which are suitable for a particular material combination and pattern. Furthermore, if the pattern of the mask is a structure having a sharp point such as a pyramid, etching may be stopped before the mask layer is completely etched away which will result in the formation of a truncated structure, here a truncated pyramid. In comparison, when using anisotropic wet etching the sidewall slope and structure geometry is limited by the etch selectivity and relative etch velocity for different crystallographic planes of the material which is etched.

In one embodiment of the invention, the step of depositing a light emitting diode structure is performed by epitaxially growing the first semiconductor layer, active region and said second semiconductor layer. As an example, epitaxial growth of GaN on a sapphire substrate is a well known method for forming a light emitting device. Here, GaN can be grown epitaxially also if the substrate is patterned.

Further effects and features of the second and third aspects of the present invention are largely analogous to those described above in connection with the first aspect of the invention.

It is noted that the invention relates to all possible combinations of features recited in the claims.

BRIEF DESCRIPTION OF THE DRAWINGS

This and other aspects of the present invention will now be described in more detail, with reference to the appended drawings showing embodiments of the invention.

DETAILED DESCRIPTION

In the present detailed description, various embodiments of light emitting device and a method for manufacturing a light emitting device according to the present invention are mainly discussed with reference to a GaN/InGaN light emitting diode formed on a sapphire substrate. It should be noted that this by no means limits the scope of the present invention which is equally applicable to light emitting devices based on other materials. In particular, other III-V material combinations may be well suited for use in a light emitting diode.

Figure 1:
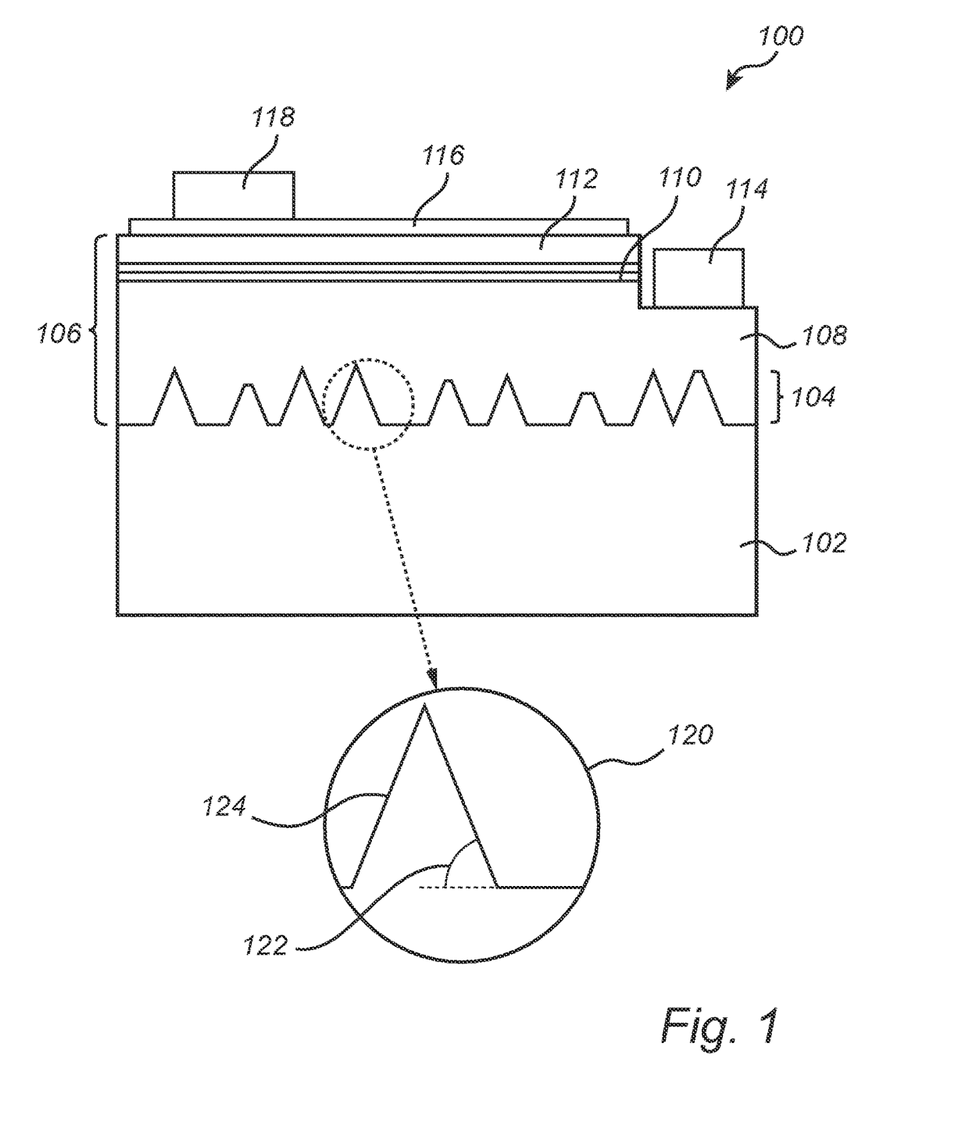
FIG. 1 schematically illustrates a light emitting device according to an embodiment of the invention.

FIG. 1 is a schematic illustration of a light emitting device 100 according to an embodiment of the present invention. The light emitting device is based on a sapphire substrate 102 comprising a plurality of protruding surface structures 104. On the sapphire substrate, a light emitting diode structure 106 is arranged comprising an n-type GaN layer 108, an active region 110 comprising a multiple quantum well (MQW) structure of InGaN, and a p-type GaN layer 112. The light emitting device 100 further comprises an n-contact 114, a transparent conducting layer 116 and a p-contact 118. In the present example, the light output surface of the light emitting diode structure can be the interface between the p-type layer and the transparent conducting layer 116 and/or at the interface between the n-type layer 108 and the sapphire substrate 102. In cases where light is extracted through the substrate, it is not required that the conducting layer is transparent. Here it is also illustrated that the protruding surface structures 104 are of different shape and height. Illustrated in the zoomed in portion 120 is the sidewall angle 122 of a protruding surface structure in relation to the plane of the substrate 102. The angle 122 defines the sidewall slope of the structure 124.

Figure 2:
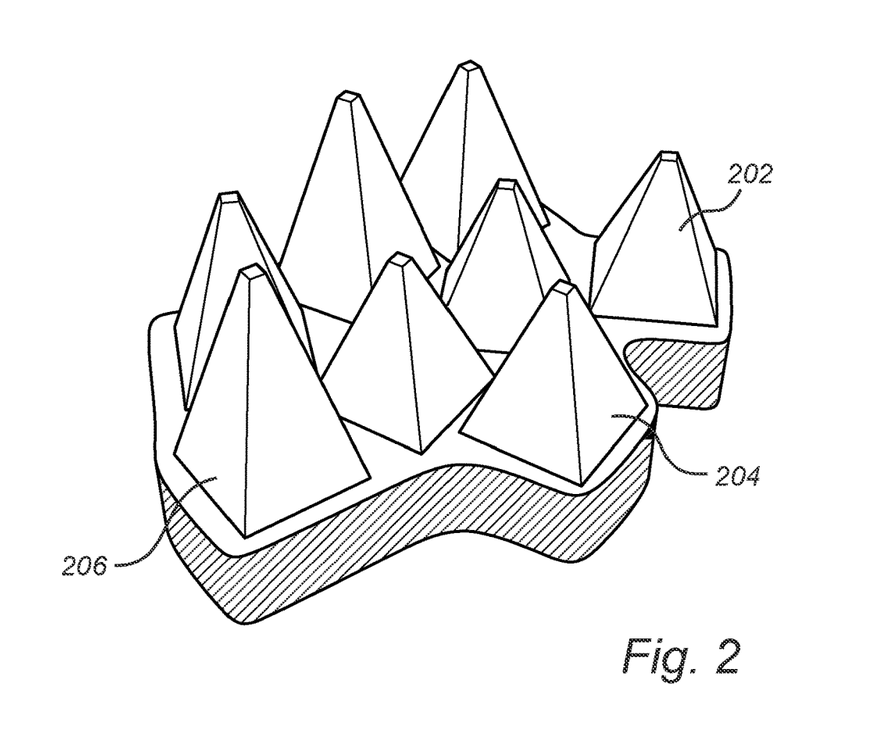
FIG. 2 schematically illustrates features of a light emitting device according to various embodiments of the invention.

FIG. 2 schematically illustrates examples of protruding surface structures. In particular it is shown that surface structures 202 and 204 have a different orientation on the substrate and that the surface structures may have different heights and sidewall slopes as illustrated by surface structures 204 and 206. The texture/structure of the interface between the semiconducting layer (GaN) and the substrate (sapphire) largely determines the extent of light extraction. In order to reduce the amount of light which is re-directed back into the light emitting diode structure, sidewall slopes in the range of 50° to 90° may advantageously be used. In particular, next neighbor angles can be chosen to avoid re-entering of the light in an adjacent structure, while all local variation can contribute to a certain degree of randomization, thus avoiding undesirable diffraction phenomena.

The dimensions of surface structures may be in the range of 100 nm to 100 μm, typically in the range of a few micrometers to tens of micrometers and preferably in the range of 1 μm to 20 μm. The height is determined by the slope and is typically of the same order of magnitude.

Figure 3:
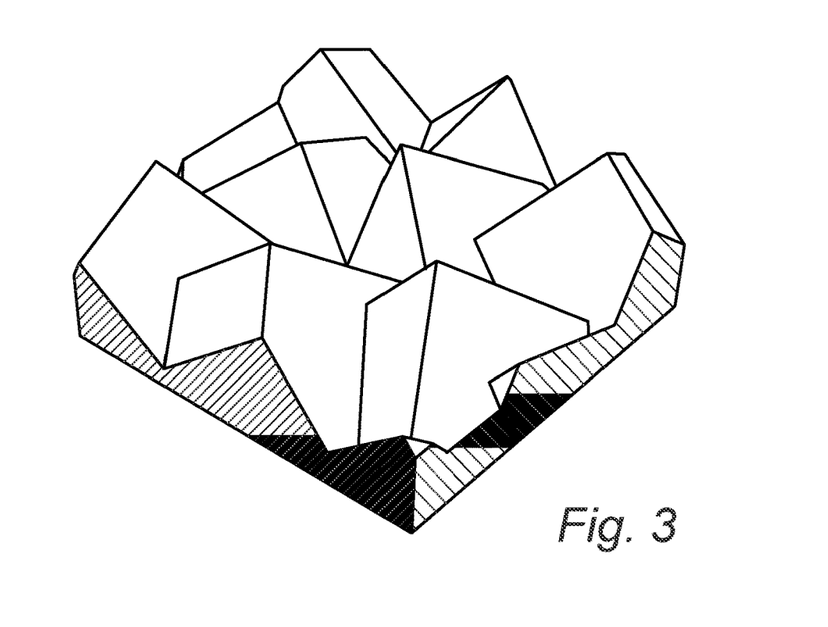
FIG. 3 schematically illustrates features of a light emitting diode according to various embodiments of the invention.

FIG. 3 schematically illustrates another example configuration of protruding surface structures. Here a homogeneous pattern is shown which is defined by peaks and valleys rather than by individual structures. Even though the protruding structures are here referred to as structures protruding from the substrate, after formation of the semiconductor layer 108, they may also be seen as the structures protruding from the semiconductor layer 108 towards the substrate 102. Thus, the peaks and valleys of the pattern 104 in the substrate 102 define corresponding valleys and peaks in the semiconductor layer 108.

It should be noted that the arbitrarily selected different shapes, heights and orientations of surface structures illustrated in FIG. 2 and FIG. 3 are not achievable by anisotropic wet etching, where the resulting surface structures are defined by the etch selectivity between different crystal planes of the etched semiconductor material. Here, the surface structures are instead formed through imprinting a three-dimensional pattern in a mask layer and subsequent dry etching of the mask layer and the underlying layer such that the pattern of the mask is transferred to the underlying layer.

Figure 4:
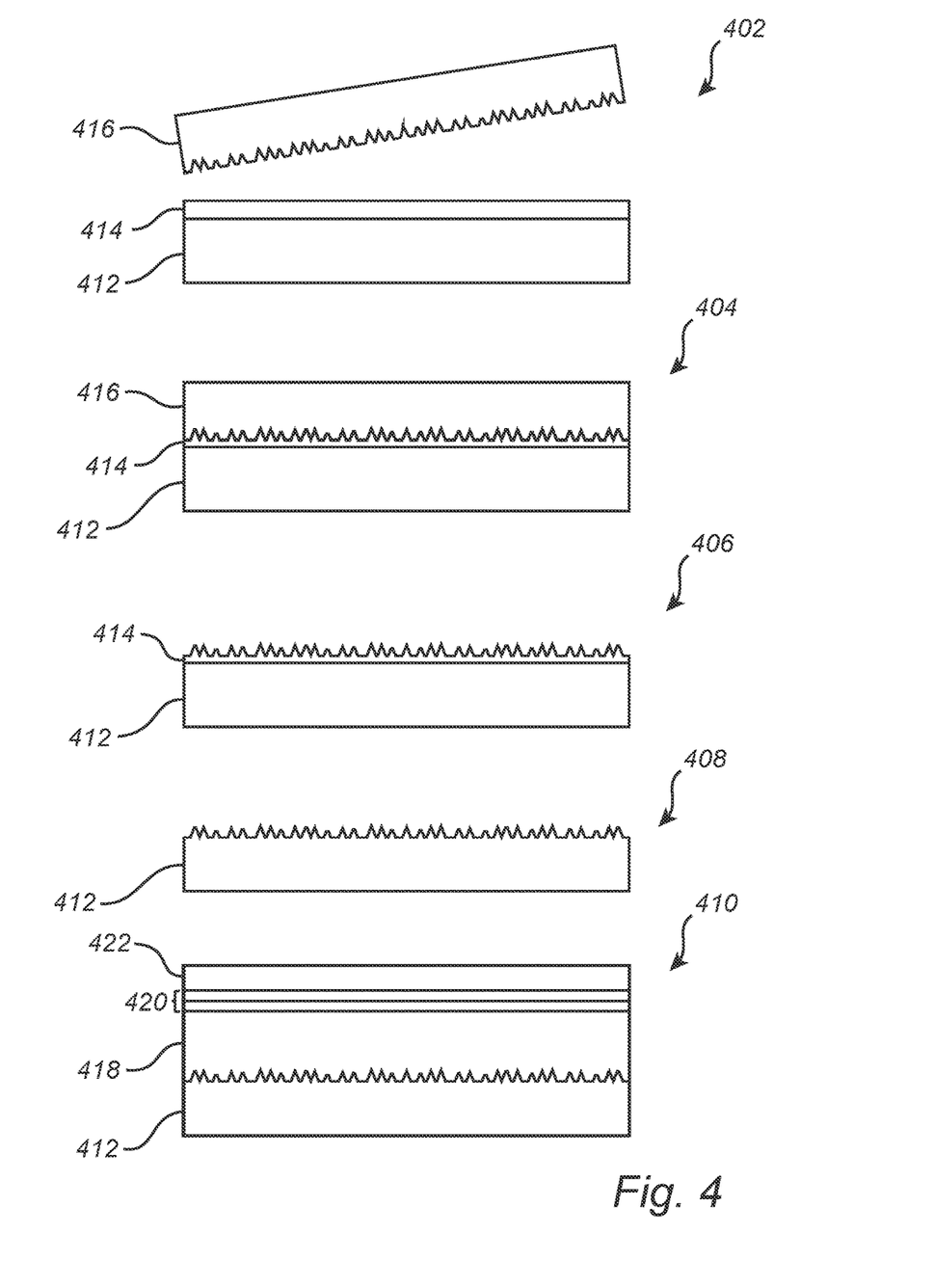
FIG. 4 schematically illustrates a method for fabricating a light emitting device according to an embodiment of the invention.

The method for manufacturing a light emitting device will be described in more detail with reference to FIG. 4. In the first step 402, a substrate 412 is provided having a liquid resist layer 414 along with a stamp 416 comprising a three-dimensional pattern. The three-dimensional pattern can first be formed in a master template by using gray-scale e-beam lithography where the highest exposure dose leads to the full development and removal of the resist material and an exposure dose lower than this only partly remove the resist layer. The master template is both expensive and difficult to fabricate, therefore it is desirable to form a secondary stamp which is used for the actual imprinting. Thus, a flexible rubber stamp is molded from the master template, where the rubber is poly-di-methyl-siloxane (PDMS). Alternatively, the stamp may also be made from other types of silicone rubber or similar materials. PDMS is typically made using a two component system that reacts at elevated temperatures and forms the rubber matrix. Here, liquid silicone rubber is poured on the three-dimensional master template where liquid rubber flows in between the features. As the silicone materials harden it adopts the inverse shape of the master pattern. After curing, the PDMS stamp is peeled from the master. The final rubber stamp enables the formation of conformal contact over large areas with minimal pressure applied. On release of the stamp from the master and later the imprint resist, the rubber can temporarily deform, aiding in release, before it relaxes back to the original shape.

Next, as illustrated in step 404, the PDMS stamp 416 is subsequently used to mold the liquid resist layer 414 that is applied on the substrate 412. The resist flows into the spaces in the stamp 416 and is cured to form a solid, with the three-dimensional shape of the original master template. Typical resist materials that can be used are based on acrylate or epoxy cross-linking or inorganic cross-linking with a sol-gel based resist. Here a silicon-oxide sol-gel based resist is used to directly mold three dimensional patterns into the silicon-oxide based resist. This has the advantage that silicon-oxide has a higher etch selectivity towards many materials compared to acrylate or epoxy based organic materials. Furthermore, as PDMS is transparent to ultraviolet (UV) and visible light, UV curing can be performed through the stamp, which makes it possible to cure the resist on non-UV transparent substrates and align the patterns in the stamp to the substrate.

By changing the etch selectivity between the imprinted resist and underlying substrate, the slope of the surface structures in the substrate can be tuned. This can also be used to enhance or lower the aspect ratio of the original pattern to a structure that is more desired in the final etch mask and cannot be directly made with a pattern generation technique such as e-beam lithography.

Furthermore, using a silicon-oxide based imprint resist has the advantage that an etch resistant material is patterned directly. Another option would be to pattern an organic resist with the 3D stamp and that this pattern is first transferred with an etch selectivity higher than 1 onto a silicon-oxide layer which is applied on the functional substrate. This would lead to the formation of enhanced aspect ratio 3D patterns in silicon-oxide, which then serves as the etch mask for the functional layer, but with enhanced toughness, compared to the original organic etch mask.

Steps 406 and 408 illustrates the three-dimensional pattern in the resist layer 414 followed by etching such that the patterns is transferred to the substrate 412. As a three-dimensional mask is used to tune the steepness of the resulting pattern in the substrate, there is no need to consider crystallographic directions and planes.

The process of etching the pattern in a sapphire substrate is preferably performed by dry etching in an ICP chamber using $BCl_3$ and $N_2$.

Once the pattern is formed in the substrate, n-type GaN 418 is epitaxially grown on the sapphire substrate. Even though different crystal planes of the sapphire are exposed, GaN will grow epitaxially and coalesce to form a homogeneous surface. Depending on the configuration of the surface structures, the thickness of the grown GaN layer may have to be varied to achieve a sufficiently low defect density for subsequent formation of the active region. Here the active region 420 is described as a plurality of InGaN quantum wells. Finally, a p-type GaN layer is formed. The steps of forming n and p contacts to reach a functioning light emitting device are well known to the person skilled in the art and are therefore not shown here.

Figure 5:
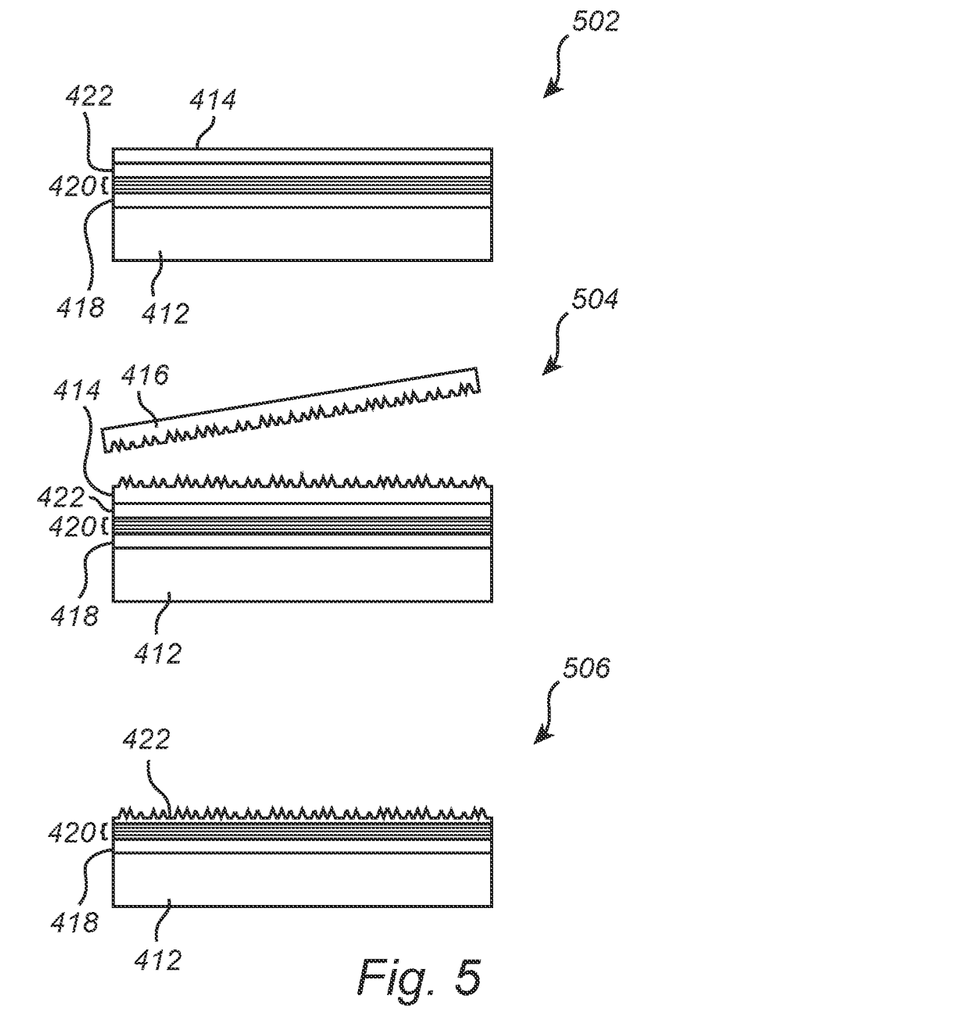
FIG. 5 schematically illustrates a method for fabricating a light emitting device according to an embodiment of the invention.

FIG. 5 schematically illustrates an embodiment of the fabrication method where a patterned surface is formed in the topmost semiconducting layer. A light emitting diode structure is formed on a planar substrate similarly to what is described in reference to FIG. 4. The difference is that here a resist mask 414 is deposited and imprinted on the top semiconductor layer 422, as illustrated in steps 502 and 504. Subsequently, the mask 414 and the underlying semiconducting layer 422 is etched and a three dimensional pattern is formed in the semiconductor.

In the case where the semiconductor is GaN, etching is performed by dry etching in an ICP chamber using $Cl_2$ or $HBr/Cl_2$. $N_2$ or Ar can be added to increase the selectivity towards the oxide mask allowing steeper angles to be created in the GaN layer. If a lower selectivity is required for creating more shallow angles, $BCl_3$ can be added to $Cl_2$.

Figure 6:
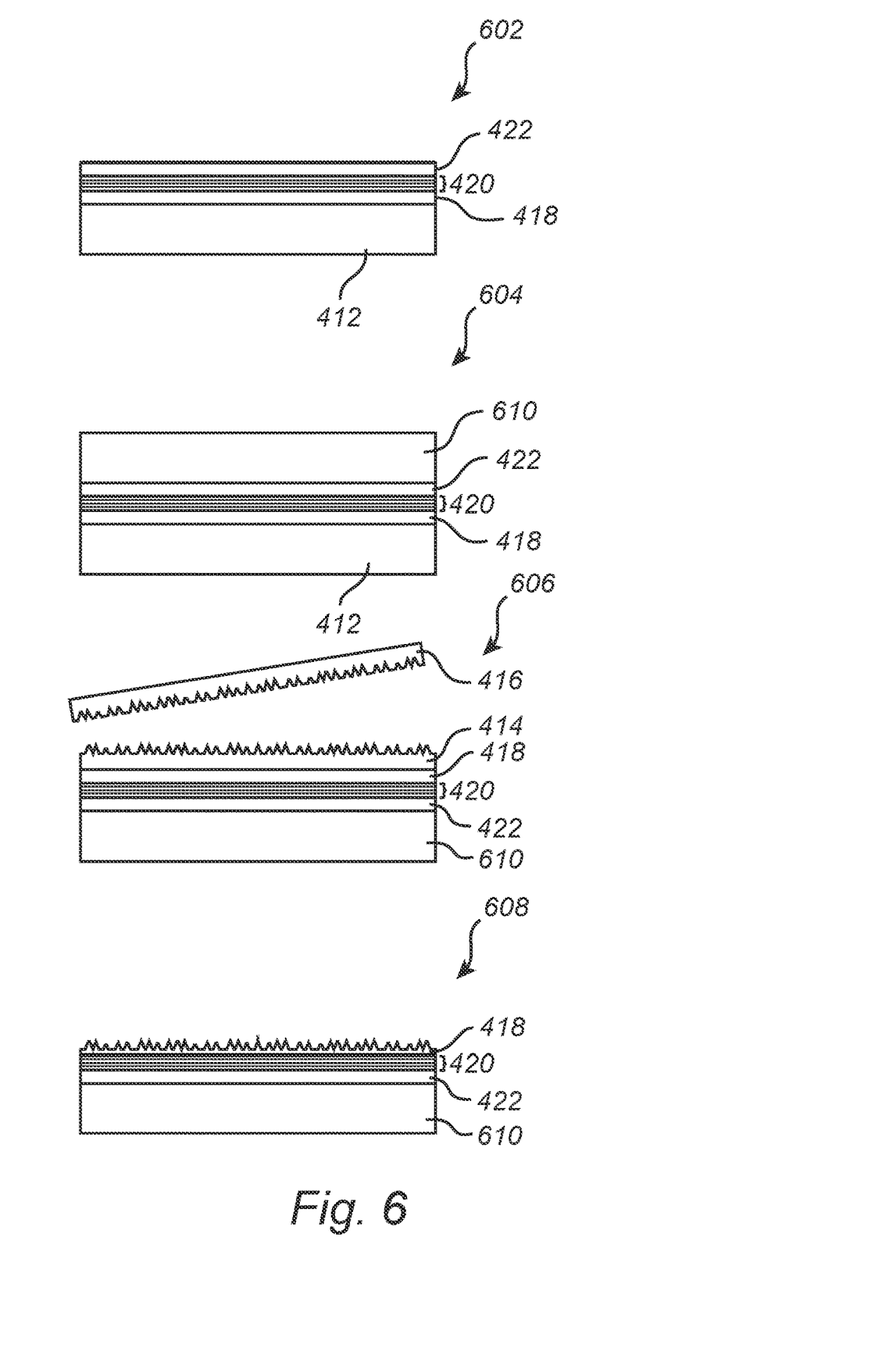
FIG. 6 schematically illustrates a fabrication method according to an alternative embodiment of the invention.

FIG. 6 schematically illustrates another embodiment of the fabrication method involving a flip-chip process. Same as in the embodiment described with reference to FIG. 5, a light emitting diode structure 418, 420, 422 is formed on a planar substrate 412. Next, 604, a carrier substrate is bonded to the topmost semiconductor layer 422 and the original substrate 412 is removed. The mask layer 414 can then be deposited and patterned 606 on the semiconductor layer 418 which was grown on the original substrate 412, resulting in a pattern comprising protruding surface structures in the first semiconductor layer 418 as illustrated in step 608. A flip-chip approach may be advantageous when it is desirable to form a pattern in the semiconductor layer, and if the topmost layer is unsuitable for doing so. For example, in a GaN/InGaN device, it may be difficult to form a sufficiently thick p-type layer of high quality. Accordingly, the n-layer which is epitaxially grown on the substrate may be exposed through a flip-chip process and subsequently used for formation of a three dimensional surface pattern.

In general it is preferred that the thermal expansion coefficient of the carrier substrate matches that of GaN. Typical substrates are GaAs, Si, (polycrystalline) alumina ($Al2O3$) and (polycrystalline) aluminum nitride (AlN) or (metal core) printed circuit board (PCB). The carrier substrate can be bonded through a temporary bond using acrylate or epoxy based UV curable resins, or a permanent bond such as solder (hot, cold compression or ultra-sonic).

Furthermore, in cases where the semiconductor layer such as GaN is etched, this can be done by providing LED tiles which are mounted on a wafer scale carrier. For this purpose a technique like surface conformal imprint lithography is crucial due to its strength in high quality imprinting on non-flat substrates.

Even though the invention has been described with reference to specific exemplifying embodiments thereof, many different alterations, modifications and the like will become apparent for those skilled in the art. For example, many different patterns, geometries and orientations of protruding surface structures may be used to achieve the desired effects of improved extraction efficiency of light from a light emitting device.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A light emitting device comprising:
   a light emitting diode structure, said diode structure comprising a first semiconducting layer, a second semiconducting layer, and an active region sandwiched between said first and second semiconducting layer, at least one of said first and second semiconducting layer having a light output surface facing away from said active region, wherein the light output surface emits light out of the diode structure,
   wherein a growth substrate used to epitaxially grow the first semiconducting layer, the second semiconducting layer, and the active region has been removed from the diode structure;
   wherein the light output surface has an area extending in an x direction and a perpendicular y direction;
   wherein said light output surface comprises a plurality of differently orientated protruding surface structures extending in both the x direction and the y direction such that there is a two-dimensional array of individual ones of the protruding surface structures, each protruding surface structure having a peak height, a sidewall slope and an orientation in relation to the active region, said plurality of protruding surface structures comprising a first set and a second set of protruding surface structures, said first set and second set of protruding surface structures differing by at least one of said peak height, sidewall slope and orientation in relation to the active region to increase light extraction out of the protruding surface structures in a direction away from the active region; and
   wherein, for at least a first subset of the protruding surface structures, which forms a majority of the protruding surface structures, their orientations with respect to other protruding surface structures directly next to each of the protruding surface structures in the first subset of protruding surface structures are different so that sloped sidewalls of the adjacent protruding surface structures do not directly face each other.

2. The light emitting device according to claim 1, wherein said first set of protruding surface structures exhibit a peak height and a sidewall slope different from said second set of protruding surface structures.

3. The light emitting device according to claim 1, wherein at least one protruding surface structure has a sidewall slope having an angle larger than 50° in relation to said active region.

4. The light emitting device according to claim 1, wherein said plurality of protruding surface structures are arranged in a pseudo-random pattern.

5. The light emitting device according to claim 1, wherein at least one sidewall slope angle of a protruding surface structure is different from that of an adjacent protruding surface structure.

6. The light emitting device according to claim 1, wherein one of said first and second semiconductor layer is a p-type doped layer and the other is an n-type doped layer.

7. The light emitting device according to claim 1, wherein one of said first and second semiconductor layer is a p-type GaN layer and the other is an n-type GaN layer.

8. The light emitting device according to claim 1, wherein one of said first and second semiconductor layer comprises a non-doped or n-doped buffer region forming the light output surface.

9. The light emitting device according to claim 1, wherein said substrate is selected from a group comprising sapphire, Si and SiC.

10. The light emitting device according to claim 1, wherein said active region is a multi quantum-well structure.

11. The light emitting device of claim 1 wherein the light output surface is an n-type semiconductor layer, and where the light emitting device is a flip-chip with electrodes on a surface of the light emitting device opposite to the light output surface.

* * * * *